(12) United States Patent
Kuroda et al.

(10) Patent No.: US 6,251,749 B1
(45) Date of Patent: Jun. 26, 2001

(54) SHALLOW TRENCH ISOLATION FORMATION WITH SIDEWALL SPACER

(75) Inventors: Shigeru Kuroda, Sakuragawa-mura (JP); Yasutoshi Okuno, Richardson; Ken Numata, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/394,785

(22) Filed: Sep. 13, 1999

Related U.S. Application Data

(60) Provisional application No. 60/100,352, filed on Sep. 15, 1998.

(51) Int. Cl.[7] .................................................. H01L 21/76

(52) U.S. Cl. .......................... 438/426; 438/296; 438/221; 257/510

(58) Field of Search .................................. 438/221, 424, 438/426, 296; 257/510

(56) References Cited

U.S. PATENT DOCUMENTS

| | | | |
|---|---|---|---|
| 5,714,414 | * 2/1998 | Lee et al. | 438/297 |
| 5,795,811 | * 8/1998 | Kim et al. | 438/424 |
| 5,882,983 | * 3/1999 | Gardner et al. | 438/424 |
| 5,918,131 | * 6/1999 | Hsu et al. | 438/296 |
| 5,950,090 | * 9/1999 | Chen et al. | 438/296 |
| 5,960,298 | * 9/1999 | Kim | 438/424 |
| 6,005,279 | * 12/1999 | Luning | 257/510 |
| 6,017,800 | * 1/2000 | Sayama et al. | 438/424 |
| 6,054,343 | * 4/2000 | Asburn | 438/424 |
| 6,080,628 | * 6/2000 | Cherng | 438/424 |
| 6,087,705 | * 7/2000 | Gardner et al. | 257/510 |
| 6,096,623 | * 8/2000 | Lee | 438/426 |
| 6,133,113 | * 10/2000 | Jeng et al. | 438/424 |

* cited by examiner

*Primary Examiner*—Charles Bowers
*Assistant Examiner*—David S. Blum
(74) *Attorney, Agent, or Firm*—Robby T. Holland; Wade James Brady III; Frederick J. Telecky, Jr.

(57) ABSTRACT

An isolation structure which protrudes above the semiconductor surface and sidewall spacers which smooth the topography over said isolation structure.

5 Claims, 4 Drawing Sheets

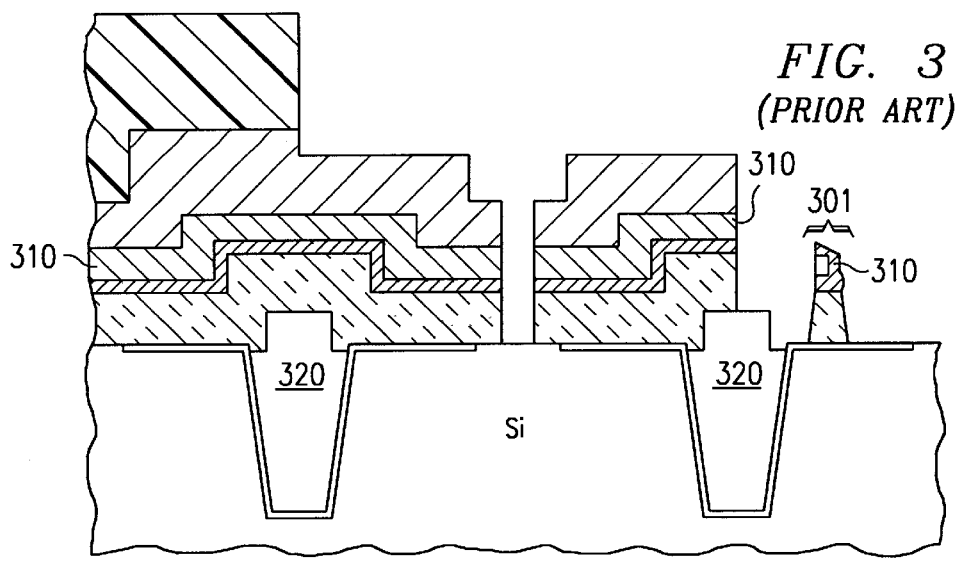
FIG. 3
(PRIOR ART)
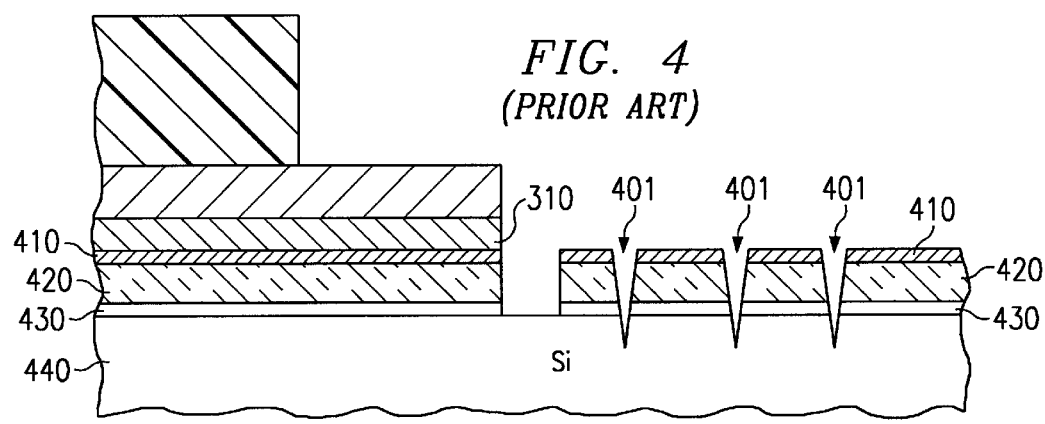
FIG. 4
(PRIOR ART)
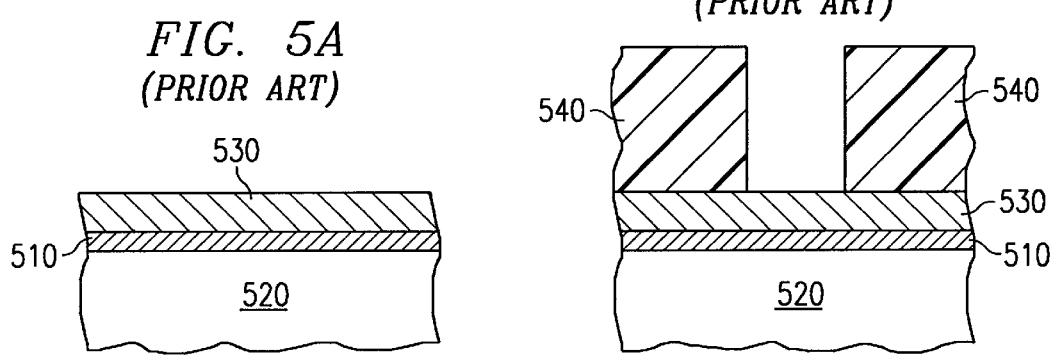
FIG. 5A
(PRIOR ART)
FIG. 5B
(PRIOR ART)

SHALLOW TRENCH ISOLATION FORMATION WITH SIDEWALL SPACER

This application claims priority under 35 USC §119(e)(1) of provisional application No. 60/100,352 filed Sep. 15, 1998.

BACKGROUND AND SUMMARY OF THE INVENTION

The present invention relates to integrated circuit structures and fabrication methods and in particular to isolation structures such as shallow trench isolation.

Background: Device Isolation

Electric circuits are implemented by connecting isolated devices through specific conducting paths. Therefore, to fabricate electric circuits from monolithic bodies of silicon, devices must be created in the substrate and isolated from one another. These devices are only later interconnected to form the desired circuit. Isolation of devices in the substrate of an integrated circuit is also important for other reasons. For example, the state (On or Off) and conductance of individual insulated gate field effect transistors (MOSFETs) can only be controlled if proper isolation exists among devices. If not, leakage currents may occur, causing dc power dissipation, noise-margin degradation, and voltage shift on dynamic nodes. In CMOS circuits, leakage current in the isolation region can also escalate latchup. Therefore, device isolation technology is critically important.

Background: Shallow Trench Isolation

One method for isolating devices from each other is shallow trench isolation (STI). In the standard STI process the pad 510 is oxidized from the silicon substrate 520 and a dummy nitride layer 530 is deposited as shown in FIG. 5(*a*). Next, a moat pattern photoresist layer 540 is deposited as shown in FIG. 5(*b*). Then a relatively shallow trench 550 0.3–0.5 microns) is etched into the silicon substrate 520 between devices as shown in FIG. 5(*c*). A short thermal liner oxidation 560 is grown on the trench 550 walls as shown in FIG. 5(*d*) to control the Si—SiO$_2$ interface quality. The shallow trench 550 is then refilled by depositing an oxide 570 or other insulating material as shown in FIG. 5(*e*). Next, the surface is planarized by chemical mechanical polishing (CMP) as shown in FIG. 5(*f*) and then the dummy nitride 530 is stripped away as shown in FIG. 5(*g*). Finally, an acid deglaze is performed resulting in the completed STI 501 structure as shown in FIG. 5(*h*). It should be noted that there is an STI shoulder 561, i.e., the STI is not perfectly planarized with the silicon substrate.

Background: Metal Gate

In recent CMOS technology, a metal gate has been introduced to significantly reduce the gate resistance. One example of a metal gate is a stack structure of tungsten (W), titanium nitride (TiN), and polysilicon. If a self-aligned-contact process is employed, the stack structure becomes even more complex because silicon nitride (SiN) may be used for caps or sidewalls on a metallization layer. An example of the more complicated structure has layers of silicon nitride (SiN), W, TiN, and polysilicon.

Etching such a stack is not trivial. Typically the process and etchant is changed for each layer depending on which layer is being etched. If the over-etching is too short, filaments 301 remain at the shoulders of STI 320 in the areas where the tungsten 310 is vertically the thickest as shown in FIG. 3. However, if the over-etching is too long, pits 401 are formed which penetrate the titanium nitride 410, polysilicon 420, gate oxide 430 and reach into the silicon substrate 440 as shown in FIG. 4. This also is undesirable. Thus, it is apparent that the process margin for metal gate etching is very narrow, especially in the tungsten etching step.

One solution to this problem is simply to reduce the step height of the STI shoulder 561. However, the problem with this solution is that stringent control of the gap-filling oxide deposition and CMP steps is needed because the total height of the STI defines the step height.

Background: Moat Corner Shape

Another problem with the prior art STIs is the shape of the moat corner. In STI processes, the silicon substrate is oxidized (typically liner oxidation) after the shallow silicon trench is etched. The shoulder of the moats are so sharp that the oxidation does not proceed uniformly, thus creating two problems.

One of the problems is current leakage. MOS transistors with thinner gate oxide have lower threshold voltages. If the moat corner touches the polysilicon of the metal gate stack, that portion has a lower threshold voltage leading to undesired current leakage between the source and the drain of the transistor.

Another problem created by the sharp moat corner is the reliability of the gate oxide. If the moat corner touches the polysilicon of the metal gate stack, the thinner gate oxide in the moat corner may break down.

Background: Contact Etching

In the prior art, there was a problem with penetration into the STI after a contact etch. The problem will be illustrated with reference to FIG. 6. In the prior art, the STI 610 was configured as depicted in FIG. 6(*a*) with liner oxide 620 and without sidewalls. A silicon nitride layer 630 was deposited to achieve a self-aligned contact etch, followed by deposition of a silicon oxide layer 640 and a photoresist layer 650 as depicted in FIG. 6(*b*). During the contact etch, the structure appeared as depicted in FIG. 6(*c*). Because of misalignment of contact pattern photoresist layer 650 to moat 660 and nitride thinning on the STI 610 shoulder, the contact etching would sometimes penetrate 670 deeply into the STI 610 as depicted in FIG. 6(*d*).

Innovative Structures and Methods

The present application discloses a shallow trench isolation (STI) with sidewalls as well as a process for fabricating such a structure.

Advantages of the disclosed methods and structures, in various embodiments, can include one or more of the following: By inserting sidewalls into the STI process, the slopes of the shoulders of the STI are smoothed. Therefore, the topography on which the metal gate stack is deposited becomes smoother and the vertical thickness of the tungsten (W) in the shoulder is reduced. Thus, the process margin of the metal gate etching, especially the W etching step, becomes wider. Furthermore, the moat corner of the present disclosure does not touch the polysilicon because of the presence of the sidewall. Therefore, the current leak of the transfer gate and the gate oxide reliability in the moat corner are not concerns. An additional advantage of the method and structure of the present disclosure is the tolerance to misalignment of the contact patterning to moat. Using the method of the prior art, a misaligned contact could penetrate into the STI. This is a serious issue, particularly when the thin silicon nitride layer is used for the self-aligned contact process. The thin nitride layer is used to stop the self-aligned contact etching. However, the layer tends to be thinner in the moat shoulder and, therefore, can lead to penetration into the STI. When the methods and structures of the present disclosure are employed, the topography of the moat shoulder is more relaxed. Therefore, the nitride layer for the self-aligned contact is not thinned. Thus, penetration into the STI does not occur regardless of whether there is misalignment of the contact pattern relative to the moat.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 3 shows a poly filament remaining after a W over etch of too short a duration.

FIG. 4 shows etching pits in silicon substrate after a W over etch of too long a duration.

FIGS. 5(a)–(h) shows formation of STI using the standard process with no sidewalls.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Formation of Shallow Trench Isolation Formation with Sidewall and Stacked Gate

Figure 1A:
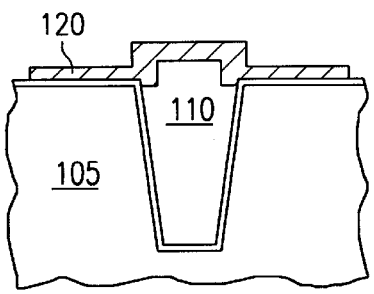
FIGS. 1(a)–(d) shows formation of an STI with sidewalls.
Figure 1B:
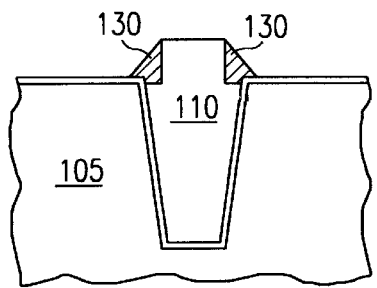
Figure 1C:
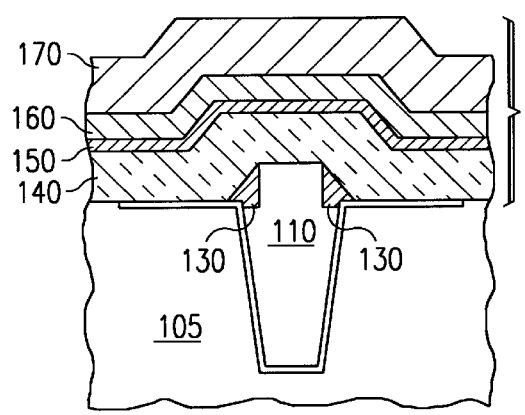

The presently preferred embodiment will be described with reference to FIG. 1. After formation of the Shallow Trench Isolation (STI) 110, deposit a layer of nitride 120 to a thickness of approximately 10 nm. The resulting structure is depicted in FIG. 1(a). Next, etch the nitride 120 using an anisotropic dry etch process to form the sidewalls 130 on the STI 110 as depicted in FIG. 1(b). The next steps in the process are the deposition of a layer of polysilicon 140, a layer of titanium nitride (TiN) 150, a layer of tungsten (W) 160, and a layer of nitride 170. These layers constitute a stacked gate 180 and the resulting structure is depicted in FIG. 1(c). In the final step of the process, the stacked gate 180 is etched using anisotropic dry etch processes with a sequential etching gas chemistry for each layer starting with the nitride layer 170, then the W layer 160, then the TiN layer 150, and finally the polysilicon layer 140 with the resulting structure depicted in FIG. 1(d).

Figure 1D:
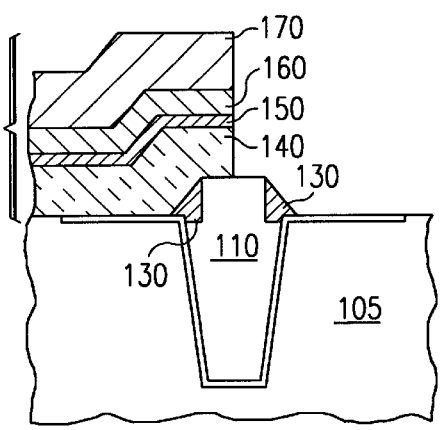

By inserting sidewalls 130 into the STI process, the shoulders of the STI 110 are relaxed. Therefore, the topography on which the metal stacked gate 180 is deposited becomes smoother and the vertical thickness of the tungsten layer 160 in the shoulder is reduced. Thus, the process margin for etching the metal stacked gate 180, especially the tungsten etching step, becomes wider. Furthermore, the moat 105 corner does not touch the polysilicon 140 of the metal stacked gate 180 because of the presence of the sidewall 130 as depicted in FIG. 1(d).

Contact Pattern Etching Process with STI and Sidewall Spacer

Figure 2A:
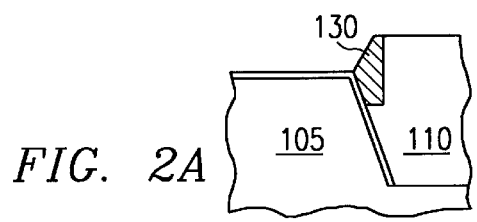
FIGS. 2(a)–(d) shows STI formed with sidewalls preventing contact etching penetration.
Figure 2B:
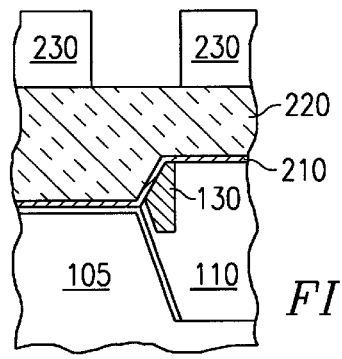
Figure 2C:
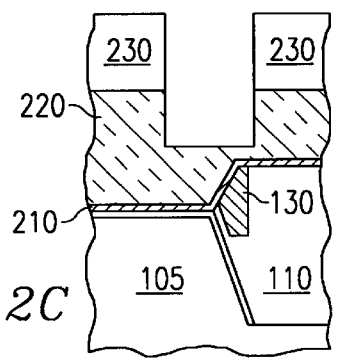
Figure 2D:
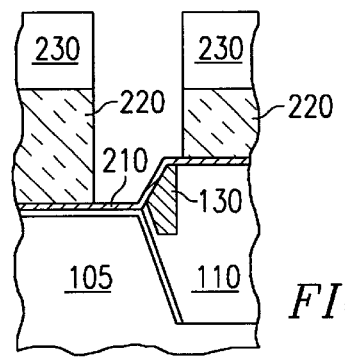
Figure 5C:
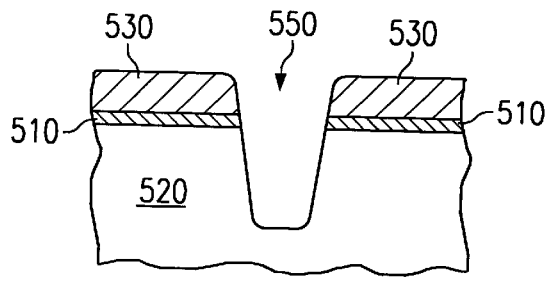
Figure 5D:
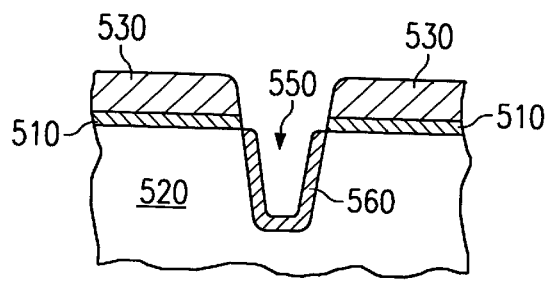
Figure 5E:
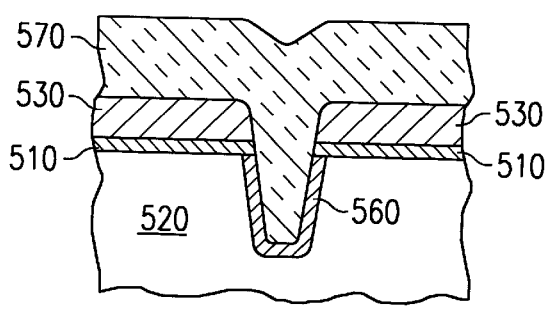
Figure 5F:
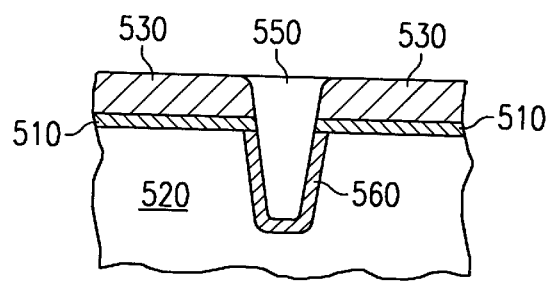
Figure 5G:
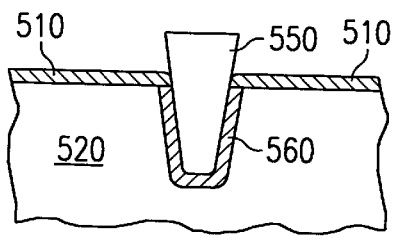
Figure 5H:
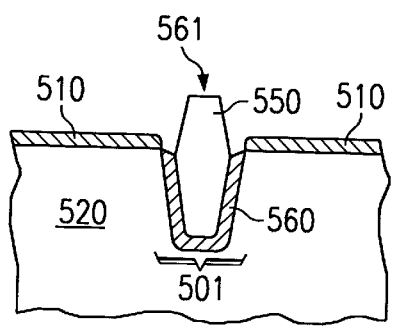
Figure 6A:
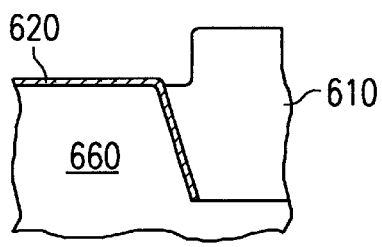
FIGS. 6(a)–(d) shows contact etching penetration into an STI without sidewalls.
Figure 6B:
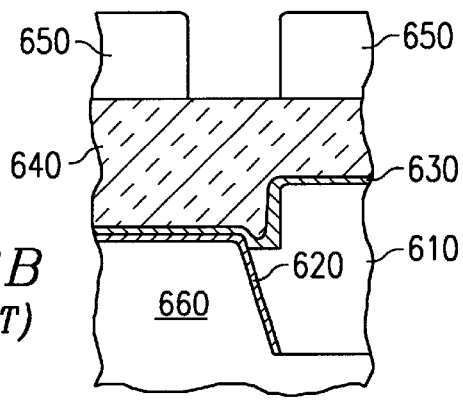
Figure 6C:
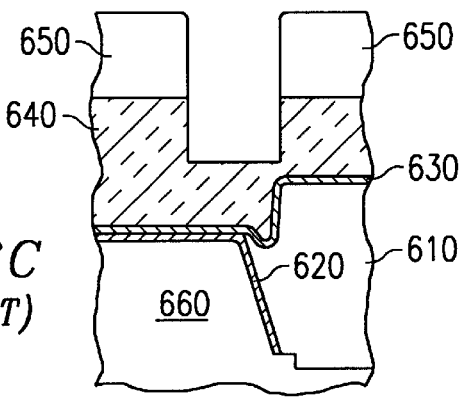
Figure 6D:
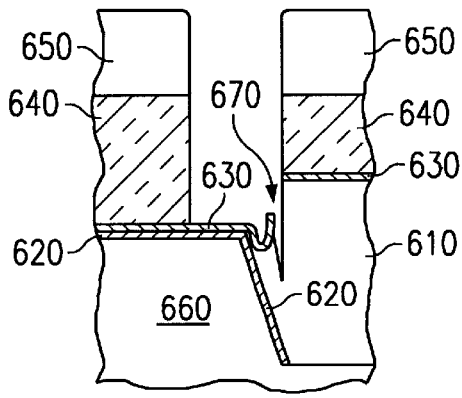

In another embodiment, an STI 110 structure with sidewalls 130 prevents contact etching penetration into the STI 110. The starting structure for this process is an STI 110 with sidewalls 130 as depicted in FIG. 2. After the STI 110 with sidewalls 130 is formed as depicted in FIG. 2(a), a thin silicon nitride layer 210, a silicon oxide layer 220 and a photoresist mask 230 are deposited as depicted in FIG. 2(b). Following deposition of the photoresist mask 230, a contact etch is performed. FIG. 2(c) depicts the structure during the contact etch and FIG. 2(d) depicts the structure after completion of the contact etch. As can be seen by referring to FIG. 2(d), the contact etching does not penetrate into the STI 110 regardless of whether the contact pattern photoresist mask 230 has been misaligned with respect to the moat 105.

According to a disclosed class of innovative embodiments, there is provided: a process for forming an isolation region, comprising the steps of: forming an isolation region which protrudes above a semiconductor surface; forming a sidewall spacer on said isolation region; forming an overlying conductor; and etching said overlying conductor; whereby said sidewall spacer reduces the occurrence of filaments and pits.

According to another disclosed class of innovative embodiments, there is provided: an integrated circuit structure, comprising: active regions of semiconductor material; an isolation region which extends above the surface of said active regions of semiconductor material and separates said active regions of semiconductor material; and a dielectric sidewall spacer; whereby said sidewall spacer reduces the occurrence of filaments and pits.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

It should also be noted that the number of layers of metallization described above does not implicitly limit any of the claims, which can be applied to processes and structures with more or fewer layers.

It should also be noted that the present teachings also apply to other isolation techniques that are similar to shallow trench isolation and extend above the surface of the substrate. Furthermore, the nitride 120 used to create the sidewall 130 can be replaced by oxide or any other material which can relax the shoulder of the isolation region.

What is claimed is:

1. A process for forming a shallow trench isolation region which provides reduced vertical thickness to regions of conductors disposed over and adjacent the trench, comprising the steps of:

forming an isolation region which protrudes above a semiconductor surface;

forming a sidewall spacer on said isolation region extending above said semiconductor surface and inclined toward said isolation region from said semiconductor surface; and forming a conductor overlying said surface and said isolation region which is substantially conformal to said semiconductor surface, said isolation region and said sidewall spacer.

2. The process of claim 1 wherein said sidewall spacer does not lie on top of said isolation region.

3. The process of claim 1 wherein said sidewall spacer is one of silicon nitride and silicon oxide.

4. The process of claim 1 wherein said overlying conductor comprises tungsten.

5. The process of claim 1 wherein said overlying conductor comprises layers each of polysilicon, titanium nitride and tungsten.

* * * * *